(12) United States Patent
Moyal

(10) Patent No.: US 6,856,182 B2
(45) Date of Patent: Feb. 15, 2005

(54) CHARGE PUMP

(75) Inventor: Michael Moyal, Munich (DE)

(73) Assignee: Xignal Technologies AG, Unterhachling (DE)

( * ) Notice: Subject to any disclaimer, the term of this patent is extended or adjusted under 35 U.S.C. 154(b) by 0 days.

(21) Appl. No.: 09/897,341

(22) Filed: Jul. 2, 2001

(65) Prior Publication Data
US 2004/0104747 A1 Jun. 3, 2004

(30) Foreign Application Priority Data
Jul. 3, 2000 (DE) .......................................... 100 32 248

(51) Int. Cl.[7] .............................................. H03L 7/093
(52) U.S. Cl. ...................................... 327/157; 327/148
(58) Field of Search ................................ 327/148, 157, 327/149, 159, 536, 537; 331/15, 16, 17

(56) References Cited

U.S. PATENT DOCUMENTS

| 5,179,297 | A |   | 1/1993  | Hsueh et al. ............... 327/537 |
| 5,363,066 | A | * | 11/1994 | Chen et al. .................... 331/17 |
| 5,801,578 | A | * | 9/1998  | Bereza ....................... 327/536 |
| 6,107,849 | A | * | 8/2000  | Williams et al. ............. 327/157 |
| 6,124,741 | A | * | 9/2000  | Arcus ........................ 327/112 |
| 6,415,007 | B1 | * | 7/2002 | Kawasumi .................. 375/374 |
| 6,420,914 | B1 | * | 7/2002 | Hasegawa ................... 327/112 |

FOREIGN PATENT DOCUMENTS

| EP | 1 037 366 A2 | 9/2000 |
| JP | 11046138 A  | 2/1999 |

* cited by examiner

Primary Examiner—Tuan T. Lam
(74) Attorney, Agent, or Firm—Pearne & Gordon LLP

(57) ABSTRACT

The invention concerns a controllable current source comprising an output terminal for current delivery, which is connected via first and second current paths with first and second supply terminals, wherein the current paths each having a supply side on/off-switchable current control device and an output side current adjustment device. According to the invention, when the current control device is switched off, a predetermined adjustment potential, whose value lies between the two supply potentials, is applied to a node between the current control device and the current adjustment device. In this way, the performance characteristics of the current source are improved, in particular, negative injection and disturbances in the output current can be avoided. When the current source is used in a PLL, the jitter behavior at the output of the VCO is significantly improved.

10 Claims, 4 Drawing Sheets

CHARGE PUMP

DESCRIPTION

The invention concerns a controllable current source as well as electronic circuits realized using this type of current source.

The invention proceeds from a controllable current source referred to as a "charge pump", comprising a first and a second supply terminal for the application of a first and a second supply potential, respectively, and an output terminal for current delivery, which is connected via a first current path with the first supply terminal and via a second current path with the second supply terminal, with the current paths each having a supply side current control device, which can be activated by a current control signal, as well as an output side current adjustment device in series to the current control device.

FIG. 1 schematically shows a current source 10 of this type, which supplies an output current I, which can be positive or negative, at an output terminal depending on two input signals (current control signals $S_1$, $S_2$). The current control signals are typically digital voltages, with one of the current control signals ("up signal") being activated for the delivery of a positive current and the other current control signal ("down signal") being activated for delivery of a negative current.

FIG. 2 shows details of this current source 10, which is supplied via a first supply terminal 12 with a first supply potential $V_1$ (in this case ground) and via a second supply terminal 14 with a second supply potential $V_2$ (in this case positive supply voltage).

An output terminal 16 for delivery of the current I is connected via a first current path 18 with the first supply terminal 12 and via a second current path 20 with the second supply terminal 14, with the current paths 18, 20 each having a field effect transistor (FET) 22 and 24 (current control device), respectively, as well as an FET 26 and 28 (output side current adjustment device). respectively, in series to this.

The FET 24 is driven by the current control signal $S_2$ for delivery of a positive current I at the output terminal 16, while in contrast, in an analogous way, an active current control signal $S_1$ leads to delivery of a negative current I.

The FETs 26, 28 serve for the purpose of adjusting the currents caused by activation of the respective FETs 22, 24. In the example illustrated, a predetermined voltage $V_a$ or $V_b$, selected to be suitable to achieve the desired current, is applied to each of the gate terminals of the FETs 26, 28.

In the region between the current control device and the current adjustment device of each current path, smaller or larger parasitic capacitances 30, 32 are inevitably present. It is disadvantageous in the known current source that these parasitic capacitances 30 and 32 must be charged or discharged upon each switching of the transistors 22, 24. This has a disadvantageous effect on the dynamic behavior of the current source (e.g. through "charge sharing" and/or "negative injection").

The parasitic capacitances have a size which cannot be exactly predetermined and also vary within a production lot. In order to reduce the influence of these varying capacitances, until now the switching and switching off of the control signals $S_1$ and $S_2$ was activated with a time lag. When the charge pump was used in a phase locked loop, this led to a phase offset of the VCO output signal relative to the reference frequency. In P. Larsson "A 2-1600-MHz CMOS Clock Recovery PLL with Low-Vdd Capability" in IEEE Journal of Solid-State Circuits, vol. 34, No. 12, December 1999, pp. 1951–1960, this temporal offset was recognized as disadvantageous and, to avoid it, it was suggested that the nodes be connected with the ground potential (node 32) and the supply potential (node 30), respectively, of the charge pump upon deactivation of the transistors. In this way, the current control signals $S_1$, $S_2$ can be provided without temporal offset, without this leading to a significant phase offset.

In addition, in the known charge pump, an undesired disturbance ("peaks" and/or transient behaviors) occurs in the output current I every time the transistors 22, 24 are switched. The publication mentioned above is not concerned with these disturbances (the improvement suggested therein even increases these disturbances when the FETs 22 and/or 24 are switched on).

The occurrence of these additional disturbances is explained in the example of the upper current path 20 in FIG. 2. The capacitive coupling at the current adjustment FET 28 between its substrate and/or channel on one hand and its gate on the other hand is presumed to decisively contribute to the disturbances. When the FET 24 is switched, there is an abrupt change in potential at the drain of the FET 28. This leads to a disturbance in the gate potential of the FET 28 and thereby to correspondingly amplified disturbances in the current of the current path 20. When the charge pump is used in a phase locked loop, this leads to a corresponding jitter at the VCO output, which is first revealed upon analysis of the output current at relatively small time scales (e.g. at a magnitude of a few ps) and therefore above all drastically worsens performance characteristics in phase locked loops for relatively high oscillation frequencies.

Correspondingly, it is an object of the invention to reduce the disturbances in the output current of a current source of the type mentioned initially.

According to the invention, it is provided that a potential adjustment device is allocated to each of the current paths, by means of which, when the current control device of the current path is inactive, a predetermined adjustment potential, whose value lies between the two supply potentials, is applied to an intermediate section lying between the current control device and the current adjustment device.

In this way, the disturbance of the output current can be significantly reduced. For this purpose, the generation of a predetermined adjustment potential, whose value lies between the two supply potentials and, when the current control device is inactive, is applied to a current path section between the current control device and the current adjustment device, is essential. On one hand, this causes the nodes to be at least partially charged and discharged via the potential adjustment device, and therefore not via the output terminal. On the other hand, the change in potential of the node upon activation and deactivation of the current control device is comparatively small, thereby above all reducing the disturbances at a smaller time scale.

Preferably the adjustment potential differs from both supply potentials by at least 5%, more preferably at least 10%, of the difference between the two supply potentials (=supply voltage).

It is particularly simple when the same adjustment potential is used for both current paths. This is then preferably approximately central between the two supply potentials, particularly deviating from this average value by less than 10%, more preferably by less than 5%, of the supply voltage.

Alternatively, both adjustment potentials can be different from one another and therefore can advantageously be individually adjusted to the two current paths to reduce the disturbances. In this case, the adjustment potential for the first current path is preferably closer to the first supply potential than the adjustment potential for the second current path. In this case, both adjustment potentials are more preferably in different halves of the supply potential interval [V1; V2].

In order to avoid the disturbances practically completely, the adjustment potential for one or both current paths can be selected as "ideal", i.e. so that the level of the disturbances is minimized. In a preferred embodiment of the invention, it is provided that the adjustment potential for at least one of the two current paths is approximately equal (particularly deviating by maximum of 10%) to that potential which would be present at the intermediate section of this current path if the current control device of this current path had just been activated without the potential adjustment device present. If the current adjustment device is formed by one or more FETs, an adjustment potential which is approximately equal to the gate potential of the current adjustment FETs neighboring the intermediate section (nodes) (particularly deviating by a maximum of 10% from this) is a good approximation of this ideal adjustment potential. Finally, it is provided in a further embodiment that each adjustment potential be provided as close as possible to the neighboring supply potential, however, only close enough that when the adjustment potential is applied, the corresponding current adjustment transistor disables, in order to avoid leakage of charge from the nodes to the output terminal.

In general, the current control device can be formed by multiple FETs in a series and/or parallel arrangement. The same applies for the current adjustment device. In one embodiment, the FETs of one of the two current paths (preferably the current path on the side of the negative supply potential) are of the n-channel type, while in contrast those of the other current path are of the p-type.

The potential adjustment device can provide the adjustment potential in a simple and efficient way between two transistors, particularly between the channels of two FETs forming a voltage divider. These two FETs can, for example, be directly connected with the two supply potentials and directly divide the supply voltage in this way. Alternatively, a voltage derived from the supply voltage can be divided.

The driving terminals of the two voltage divider transistors can have the control signals derived from the current control signal applied to them in such a way that, when the current control device is inactive, both transistors rather conduct, while in contrast, when the current control device is active, both transistors rather disable and thus insulate the node. The voltage divider preferably has, on one hand, one (or more) n-channel FET(s) and, on the other hand, one (or more) p-channel FET(s) which have driving signals, derived from the current control signal, which are inverse to one another applied to their gate regions. More preferably, at least one amplifier arrangement, particularly at least one inverting amplifier arrangement, is upstream from each driving input of the FETs.

The invention will be described in more detail in the following in an exemplary manner with reference to the attached drawings.

FIG. 1 schematically illustrates a charge pump;

Figure 1:
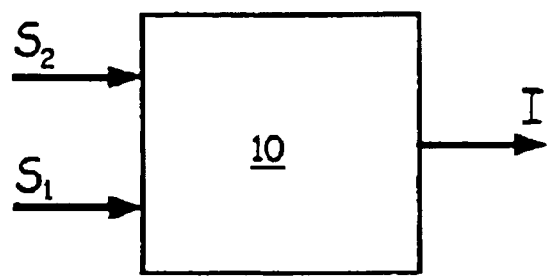
Figure 2:
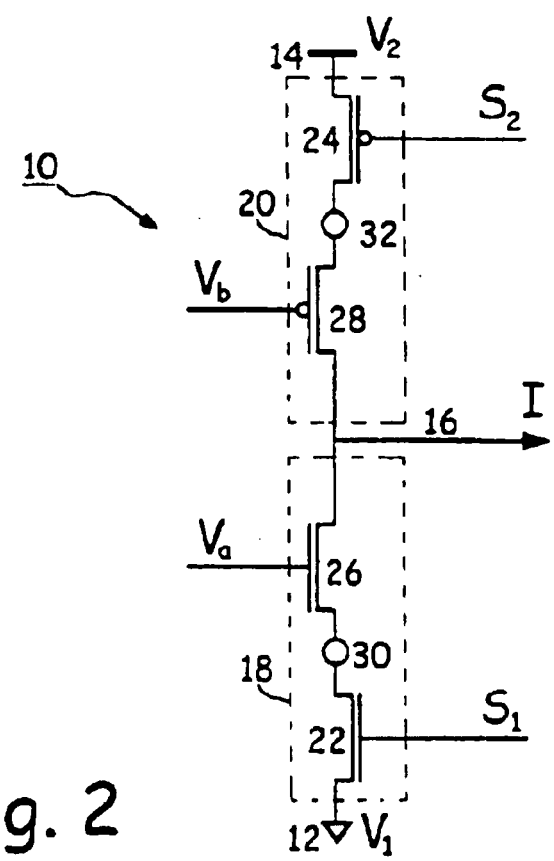
FIG. 2 illustrates details of the charge pump according to FIG. 1.

FIGS. 1 and 2 illustrate, as described Initially, a charge pump in a typical embodiment In the following description of exemplary embodiments of the invention, the same reference numbers are used for analogous components and, essentially, only the particularities of the embodiments according to the invention are discussed. As for the rest, reference is hereby expressly made to the description of the typical embodiment according to FIGS. 1 and 2 and the respective exemplary embodiments already described.

Figure 3:
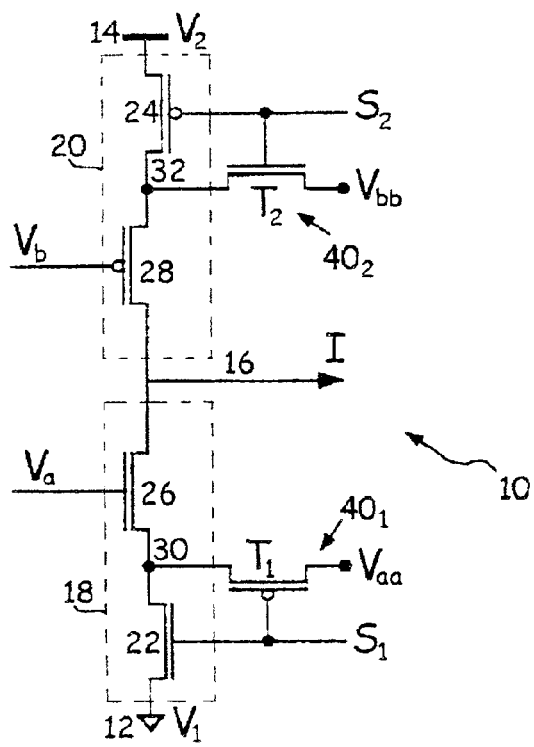
FIG. 3 illustrates a charge pump according to a first embodiment of the invention.

FIG. 3 shows a first exemplary embodiment of the current source according to the invention, in which two transistors $T_1$ and $T_2$ (in this case FETs), together with respectively allocated potential generation devices for generation of potentials $V_{aa}$ and $V_{bb}$, form potential adjustment devices $40_1$ and $40_2$, by means of which, when the current control devices 22, 24 are inactive, the adjustment potential of $V_{aa}$ and $V_{bb}$ respectively, is applied to the intermediate sections 30, 32. These potentials $V_{aa}$ and $V_{bb}$ both lie between the two supply potentials $V_1$ and $V_2$:

$$V_{aa} = V_1 + V_{t1}$$

$$V_{bb} = V_2 - V_{t2}$$

with $V_{t1}$ and $V_{t2}$ being selected with respect to the threshold voltage of the n-channel FET 26 and the threshold voltage of the p-channel FET 28, respectively, in such a way that these FETs just disable.

The adjustment potentials $V_{aa}$, $V_{bb}$ selected in this way are an approximation for the respective "ideal" potentials. A further favorable adjustment potential for the current path 20 is equal to that potential which would be present at the node 32, if the potential adjustment device was not provided, shortly after the FET 24 was activated (connected through) by the signal $S_2$ and the FET 22 of the current path 18 was already inactivated (disabled). In driving, it can also be provided that both current control signals occasionally be activated simultaneously.

If the FET 24 or the FET 22 is switched off, the path sections 32 and 30, respectively, are thus precharged by the adjustment potentials and the disturbances described above are drastically reduced. In addition, leakage currents are thus avoided between the path sections 32, 30 and the output terminal, because the adjustment potentials change the voltage between the gate and drain regions of the current adjustment FETs 28, 26 in such a way that these FETs essentially disable.

Figure 4:
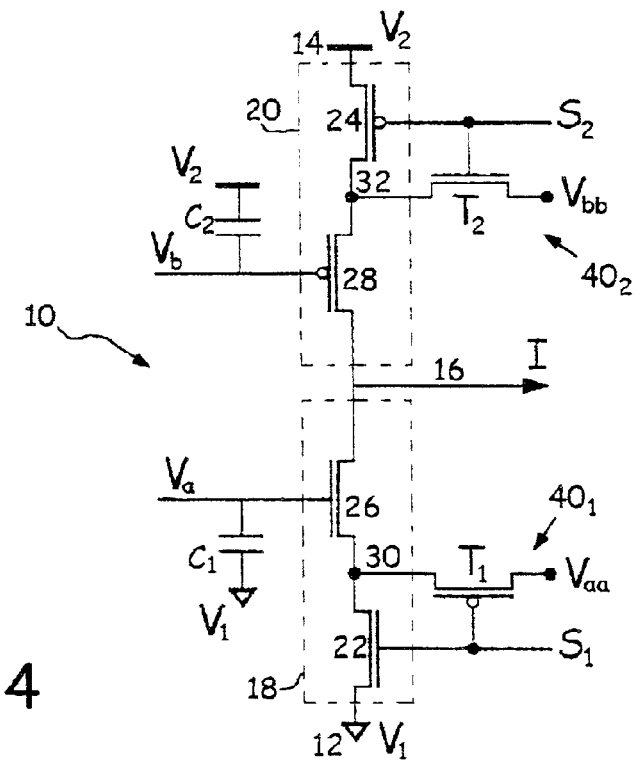
FIG. 4 illustrates a modification of the embodiment according to FIG. 3.

FIG. 4 shows a modification of the circuit arrangement according to FIG. 3, in which the circuit behavior is further improved in that the reference potentials $V_a$, $V_b$ are filtered. In combination with the application of adjustment potentials $V_{aa}$, $V_{bb}$, which lie between the supply potentials $V_1$ and $V_2$, this measure leads to a further improvement of the behavior of the circuit, because the effects of the initially described capacitive coupling of the gate regions of the current adjustment FETs 26, 28 to their drain regions is further reduced.

For filtering of the potentials $V_a$, $V_b$, they are each capacitively coupled to at least one of the supply potentials $V_1$, $V_2$.

In the example illustrated, the potential $V_a$ is connected via a capacitance $C_1$ with the potential $V_1$, while in contrast the potential $V_b$ is connected via a further capacitance $C_2$ with the potential $V_2$. This design, in which a gate potential of a current adjustment FET is capacitively coupled only to the respective neighboring supply potential, has the advantage that a disturbance in the supply voltage (such as those often generated by further units of an integrated circuit) is compensated for via this capacitive coupling and thus has only insignificant effects on the output current.

Figure 5:
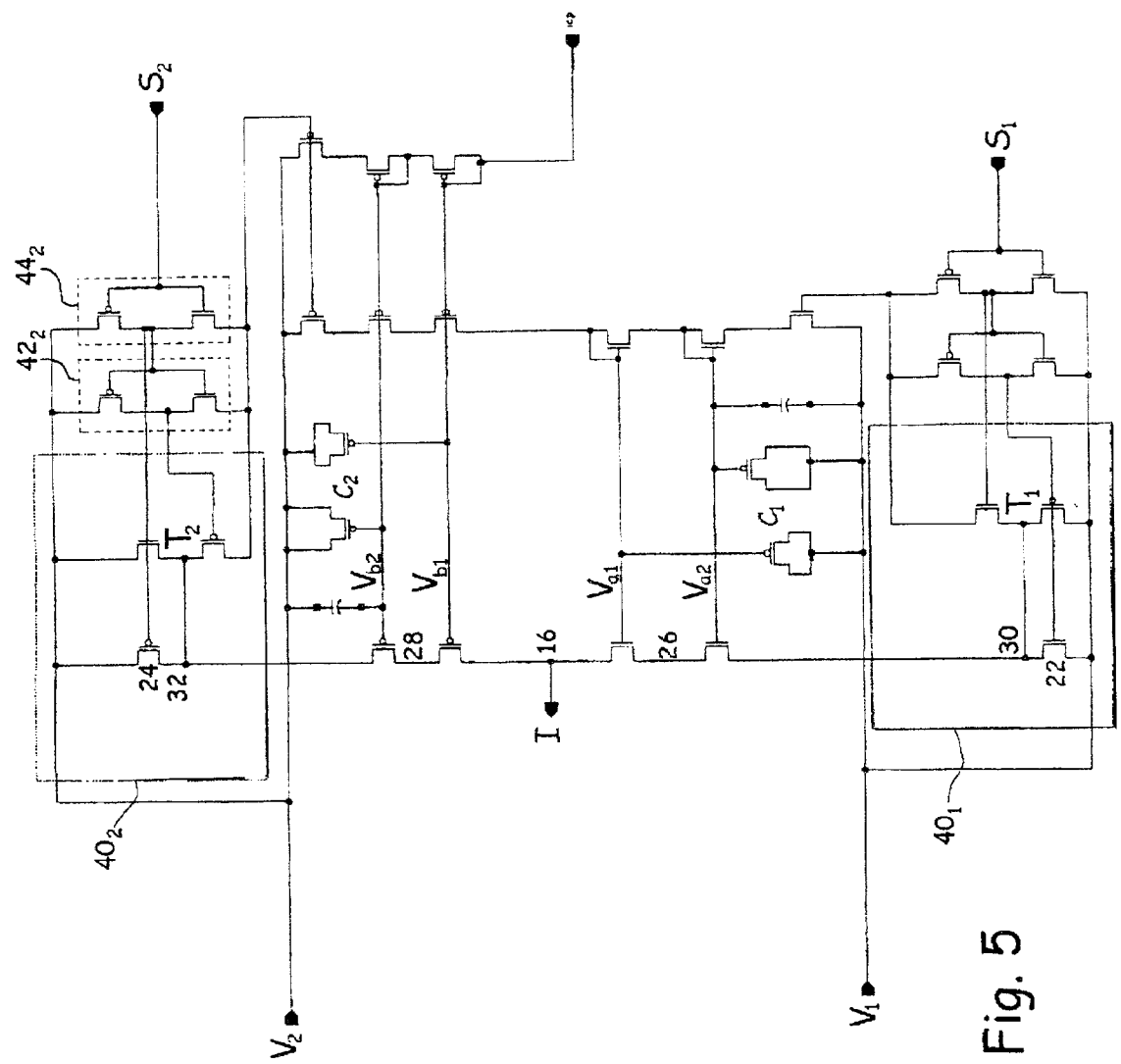
FIG. 5 illustrates a charge pump according to a second embodiment of the invention.

FIG. 5 shows a further embodiment of the current source according to the invention. In contrast to the preceding embodiments, a characteristic of this is that the current adjustment devices 26, 28 are each formed from a series circuit of multiple (in this case two) transistors. In this design, the adjustment of the current in the paths 18, 20 is more precise, in particular, the adjusted currents depend less on the voltage at the current adjustment devices and/or the potential at the output terminal 16.

The two transistors (in this case FETs) of each current adjustment device have, in this case, different gate potentials $V_{a1}$ and $V_{a2}$ and $V_{b1}$ and $V_{b2}$, respectively, applied to them. As is obvious from the figure, each of the gate potentials is hereby capacitively coupled to one of the neighboring supply potentials $V_1$, $V_2$.

A further characteristic is the generation of the adjustment potential at the output of a voltage divider $T_1$ and/or $T_2$, formed by two transistors. These are described with reference to the example of the upper part of FIG. 5. One of the voltage divider FETs has the same signal applied to its gate terminal as the gate terminal of the FET of the associated current control device 22 or 24, while in contrast the other of the two voltage divider FETs has a signal inverted to this applied to its gate. These two signals are each supplied from an amplifier circuit (CMOS inverter) $42_2$ or $44_2$, which is connected between the supply potentials $V_1$, $V_2$ and formed by a series circuit of two transistors. One of these amplifier circuits ($44_2$) is directly driven with the current control signal $S_2$, while in contrast the driving of the other amplifier circuit $42_2$ occurs indirectly through the current control signal $S_2$, specifically through an output signal of the first amplifier arrangement $44_2$.

The current source according to the invention can, as mentioned, form a part of an integrated circuit.

A controllable voltage source with improved performance characteristics can be realized by connecting an integrator element downstream. The arrangement of a voltage controlled oscillator (VCO) at the output of this type of voltage source leads to a correspondingly controllable oscillator device.

The integration of the current source according to the invention in a phase locked loop, e.g. used widespread as "PLL", is particularly advantageous. This type of circuit layout is illustrated in FIG. 6.

Figure 6:
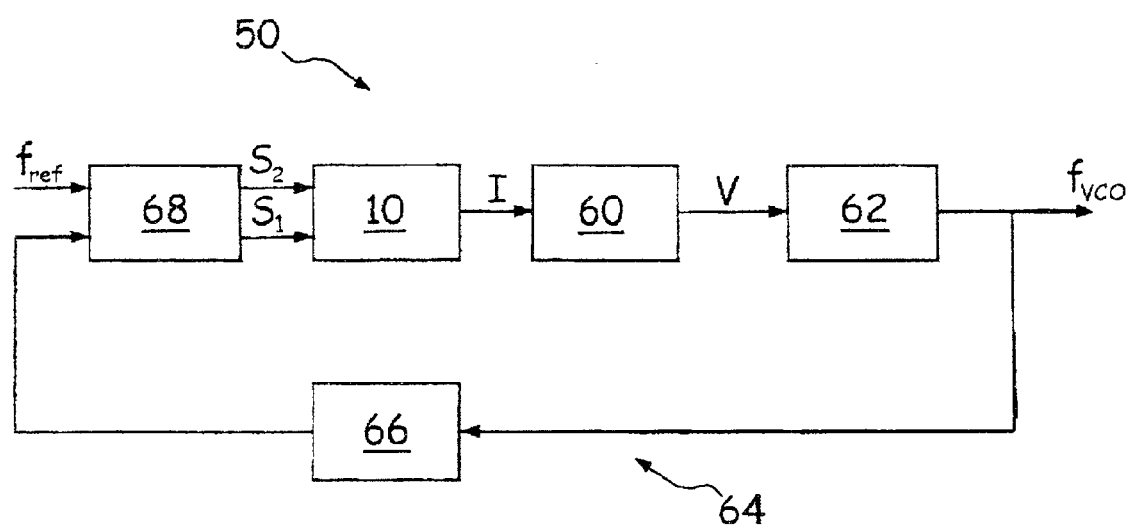
FIG. 6 schematically illustrates a phase locked loop, in which a charge pump according to the invention is used.

As is obvious from FIG. 6, on the input side the phase locked loop 50 comprises a phase detector 68, which is supplied with a reference signal $f_{ref}$ and compares the phase of this signal with a feedback signal which is fed back and also input into the phase detector 68. Depending on the result of this comparison, either the signal $S_1$ or the signal $S_2$ is activated. These digital signals are input into a charge pump 10 according to the invention. The output current I of this charge pump is converted via an integrator 60 into a voltage V and used as the input signal of a downstream VCO 62. This VCO 62 then delivers an output signal $f_{VCO}$ which is simultaneously fed back as the feedback signal to the phase detector 68 via a feedback path 64.

The phase locked loop can, for example, be used for clock recovery in an integrated circuit and a divider 66 can be located in the feedback path 64 in a known way for multiplication of the frequency of the output signal $f_{VCO}$ relative to the input signal $f_{ref}$.

Modern PLLs with clock frequencies of up to 1 GHz and more have very strict requirements for the clock-jitter behavior. In many cases, the jitter on the output signal of the VCO is the limiting factor for the quality of systems in various applications, such as data communication or consumer electronics systems. In these types of systems, the disturbance produced by the use of a common charge pump due to the negative injection can significantly contribute to worsening of the jitter behavior. Through the invention, both the size of disturbance peaks and their duration in the output current of the charge pump can be reduced significantly.

What is claimed is:

1. A controllable current source, comprising
a first and a second supply terminal (12, 14) for the application of a first and a second supply potential ($V_1$, $V_2$), respectively,
an output terminal (16) for current delivery, which is connected via a first current path (18) with the first supply terminal (12) and via a second current path (20) with the second supply terminal (14),
with the current paths (18, 20) each having a supply side current control device (22, 24), activatable by a current control signal ($S_1$, $S_2$), for on/off-switching of the respective current control device (22, 24), as well as an output side current adjustment device (26, 28) in series to the current control device, for adjusting a current caused by activation of the respective current control device (22, 24),
wherein the current paths (18, 20) are each allocated a potential adjustment device ($40_1$, $40_2$), by means of which, when the current control device (22, 24) of the current path (18, 20) is inactive, a predetermined adjustment potential ($V_{aa}$, $V_{bb}$), whose value lies between the two supply potentials, is applied to an intermediate section (30, 32) lying between the current control device and the current adjustment device, and
wherein the potential adjustment device ($40_1$, $40_2$) comprises a voltage divider formed by two serially connected FETs for dividing a voltage applied to the voltage divider and for supplying a potential at a node between the two voltage divider FETs as the adjustment potential ($V_{aa}$, $V_{bb}$).

2. The controllable current source according to claim 1, wherein the current control device (22, 24) has at least one FET, whose channel forms a section of the current path (18, 20).

3. The controllable current source according to claim 1, wherein the current adjustment device (26, 28) has at least one FET, whose channel forms a section of the current path (18, 20).

4. The controllable current source according to claim 1, wherein the two adjustment potentials ($V_{aa}$, $V_{bb}$) are different from one another.

5. The controllable current source according to claim 1, wherein the adjustment potential ($V_{aa}$) for the first current path (18) lies closer to the first supply potential ($V_1$) than the adjustment potential ($V_{bb}$) for the second current path (20).

6. The controllable current source according to claim 1, wherein the adjustment potential ($V_{aa}$, $V_{bb}$) for one of the two current paths (18, 20) is approximately equal to that potential which is present at the intermediate section (30, 32) of this current path (18, 20) when the current control device (22, 24) of this current path (18, 20) is activated.

7. The controllable current source according to claim 1, wherein the gate terminals of the two voltage divider FETs have control signals, derived from the current control signal $S_1$, $S_2$, applied to them in such a way that, when the current control device (22, 24) is inactive, both voltage divider FETs conduct, while in contrast, when the current control device is active, both voltage divider FETs disable.

8. A controllable voltage source, comprising a controllable current source (10) according to claim 1 and a downstream integrator (60).

9. A controllable oscillator device, comprising a controllable voltage source (10, 60) according to claim 8 and a downstream VCO (62).

10. A phase locked loop (50), comprising a phase detector (68), a downstream controllable oscillator device (10, 60, 62) according to claim 9, and a feedback path (64) from the oscillator device (10) to the phase detector (68).

* * * * *